United States Patent
Starkston et al.

(10) Patent No.: US 9,832,860 B2
(45) Date of Patent: Nov. 28, 2017

(54) PANEL LEVEL FABRICATION OF PACKAGE SUBSTRATES WITH INTEGRATED STIFFENERS

(71) Applicant: Intel Corporation, Santa Clara, CA (US)

(72) Inventors: Robert Starkston, Phoenix, AZ (US);
John Guzek, Chandler, AZ (US);
Patrick Nardi, Scottsdale, AZ (US);
Keith Jones, Chandler, AZ (US);
Javier Soto Gonzalez, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 14/498,958

(22) Filed: Sep. 26, 2014

(65) Prior Publication Data

US 2016/0095209 A1 Mar. 31, 2016

(51) Int. Cl.
*H05K 1/02* (2006.01)
*H01L 23/00* (2006.01)
(Continued)

(52) U.S. Cl.
CPC ........... *H05K 1/0271* (2013.01); *H01L 23/16* (2013.01); *H01L 23/49833* (2013.01);
(Continued)

(58) Field of Classification Search
CPC .............. H01L 23/12; H01L 23/49811; H01L 23/49866; H01L 23/16; H01L 23/562;
(Continued)

(56) References Cited

U.S. PATENT DOCUMENTS 6,391,422 B1 * 5/2002 Mori ..................... H01L 23/142
257/E23.006
6,472,762 B1 * 10/2002 Kutlu ..................... H01L 23/36
257/706
(Continued)

FOREIGN PATENT DOCUMENTS

JP 2003-142634 A 5/2003
JP 2009-117703 A 5/2009
(Continued)

OTHER PUBLICATIONS

Notice of Allowance (2 pages) from the Taiwan Intellectual Property Office for Taiwan Patent Application No. 104127013 dated Jan. 24, 2017.
(Continued)

*Primary Examiner* — Tod T Van Roy
*Assistant Examiner* — Delma R Forde
(74) *Attorney, Agent, or Firm* — Schwabe Williamson & Wyatt P.C.

(57) ABSTRACT

Techniques are disclosed for forming a package substrate with integrated stiffener. A panel of package substrates are provided. An adhesion layer is then formed on each package substrate of the panel of package substrates. A panel of stiffeners are then attached to the panel of package substrates by the adhesion layer, each stiffener corresponding to a respective package substrate. The panel of package substrates is then singulated into individual package substrates with integrated stiffeners. The stiffeners on the singulated package substrates include tabs that extend to the edges of the package substrates.

15 Claims, 8 Drawing Sheets

(51) Int. Cl.
  *H01L 23/16* (2006.01)
  *H01L 23/498* (2006.01)
  *H05K 3/00* (2006.01)
  *H05K 3/28* (2006.01)

(52) U.S. Cl.
  CPC ............ *H01L 23/562* (2013.01); *H01L 24/97* (2013.01); *H05K 3/0097* (2013.01); *H01L 2224/16225* (2013.01); *H01L 2924/15311* (2013.01); *H05K 3/0052* (2013.01); *H05K 3/284* (2013.01); *H05K 2201/09136* (2013.01); *H05K 2201/10977* (2013.01); *H05K 2201/2009* (2013.01)

(58) Field of Classification Search
  CPC ....... H01L 23/00; H01L 23/31; H01L 23/498; H01L 23/3142; H01L 23/3178; H01L 23/49827; H01L 23/3128; H01L 24/97; H01L 24/81; H01L 2224/16225; H01L 2224/97; H01L 2224/32225; H01L 2224/48227; H01L 2224/73204; H01L 2224/73253; H01L 2924/15311; H01L 21/4853; H01L 21/4878; H01L 21/48; H01L 21/4871–21/4882; H05K 1/02; H05K 1/0271; H05K 1/11; H05K 1/18; H05K 1/111; H05K 1/181; H05K 3/00; H05K 3/0097; H05K 3/0052; H05K 3/284; H05K 2201/09136; H05K 2201/10977; H05K 2201/2009; H05K 2201/10674
  See application file for complete search history.

(56) References Cited

U.S. PATENT DOCUMENTS

| | | | | |
|---|---|---|---|---|
| 6,989,593 | B2* | 1/2006 | Khan | H01L 23/3677 257/706 |
| 2002/0079572 | A1 | 6/2002 | Zhao et al. | |
| 2003/0146506 | A1* | 8/2003 | Khan | H01L 21/4857 257/737 |
| 2003/0146511 | A1* | 8/2003 | Zhao | H01L 23/3677 257/739 |
| 2006/0249852 | A1* | 11/2006 | Chiu | H01L 23/36 257/778 |
| 2008/0054490 | A1* | 3/2008 | McLellan | H01L 21/561 257/778 |
| 2008/0211079 | A1* | 9/2008 | Onodera | H01L 25/105 257/686 |
| 2009/0115048 | A1* | 5/2009 | Zhao | H01L 23/24 257/690 |
| 2009/0203171 | A1* | 8/2009 | Takemasa | H01L 21/561 438/113 |
| 2014/0036454 | A1* | 2/2014 | Caskey | H05K 1/0298 361/735 |
| 2014/0048326 | A1* | 2/2014 | Lin | H05K 9/00 174/377 |
| 2014/0048951 | A1* | 2/2014 | Lin | H01L 23/481 257/774 |
| 2014/0157593 | A1* | 6/2014 | Lin | H01L 24/19 29/832 |
| 2014/0160688 | A1* | 6/2014 | Lu | H05K 1/181 361/728 |
| 2015/0115433 | A1* | 4/2015 | Lin | H01L 23/3675 257/712 |
| 2015/0162307 | A1* | 6/2015 | Chen | H01L 23/49827 257/712 |

FOREIGN PATENT DOCUMENTS

| | | |
|---|---|---|
| TW | 517359 | 1/2003 |
| TW | 2014-05736 A | 2/2014 |

OTHER PUBLICATIONS

Office Action including Search Report (8 pages) from the Taiwan Examiner of the Intellectual Property Office (the IPO) for Taiwan Patent Application No. 104127013 dated Oct. 12, 2016 and English Translation (6 pages) thereof.
First Official Action (5 pages) from the Japan Patent Office for Japanese Patent Application No. 2015-166538 dated Jun. 7, 2016 and English Translation (5 pages) thereof.
Notice of Allowance (3 pages) from the Japan Patent Office for Japanese Patent Application No. 2015-166538 dated Oct. 25, 2016.
Office Action and Search Report for Taiwan Patent Application No. 106107057 (including translation), dated Sep. 12, 2017, 13 pgs.

\* cited by examiner

PANEL LEVEL FABRICATION OF PACKAGE SUBSTRATES WITH INTEGRATED STIFFENERS

TECHNICAL FIELD

Embodiments generally relate to semiconductor packaging and, more specifically, methods and apparatuses for stiffening package substrates.

BACKGROUND

An increasing demand for smaller, more compact electronic devices has driven an increased effort to reduce the sizes of its internal components. The internal components include packaged devices. Thus, there is an increased effort to decrease the size of packaged devices. Packaged devices typically include an integrated circuit device coupled to a package substrate. The package substrate interconnects the integrated circuit device to a system board. To minimize the amount of space occupied by the packaged device, industry leaders have invested in ways to decrease the thickness of package substrates. Decreasing the thickness of package substrates, however, is not without issues.

As package substrates continue to decrease in thickness, the amount of mechanical instability, such as bending or curving, increases. Such mechanical instability is a significant contributor to fabrication issues after wafer singulation. For instance, bent or curved package substrates can affect throughput and yield if the package substrates cannot be attached properly onto a system board. As a result, methods have been implemented in the package assembly process to address these issues.

Substrate manufacturing processes are performed in a panel or subpanel of packages. In the last steps of substrate manufacturing, the panel is singulated to form individual package substrates. The package substrates are then attached to an integrated circuit, such as a semiconductor die, during the assembly process. The attachment can cause the package substrate to warp or curve due to different coefficient of thermal expansions for the integrated circuit and the package substrate. To address the issues related to bent or curved package substrates, each individual package substrate may be flattened by attaching a stiffener.

Current methods attach stiffeners to individual package substrates in the package assembly process. The stiffeners may be formed by any conventional process, such as a transfer molding process. In such methods, a mold is placed directly around a singulated package substrate. A mold compound, such as a filled epoxy material, is then injected into the mold. After the mold compound cures, the package is removed and the cured mold compound remains as a stiffener on the singulated package substrate. Performing the transfer molding process at a singulated level is costly and has high total processing time for large volumes of production.

Alternatively, the stiffeners may be incorporated by an attachment process. The attachment process adheres a pre-made stiffener to a singulated package substrate by an adhesive material. Attaching stiffeners to the singulated package substrates can be less costly than the transfer molding process, but can have low alignment accuracy and high total processing time for large volumes of production. Accordingly, conventional processes for stiffening package substrates are inefficient and time consuming.

Attaching stiffeners after singulation has plenty of additional shortcomings. For instance, attaching stiffeners after singulation increases the chances of having rotational misalignment and/or translational misalignment between the stiffeners and the package substrates. Misalignment can create overhang where the stiffener protrudes over an edge of the package substrate. To compensate for overhang, edges of the package substrates may be extended. Extending the edges of the package substrates may result in a detrimental increase in package size.

DETAILED DESCRIPTION

Figure 1A:
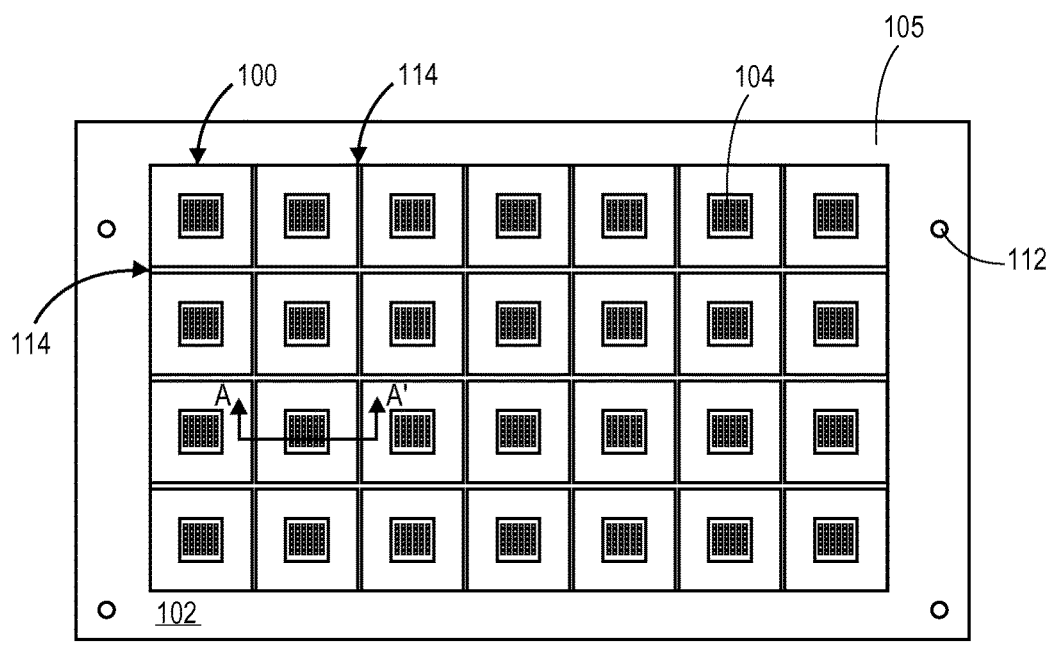
FIG. 1A illustrates a top-view perspective of a panel of package substrates, in accordance with an embodiment of the invention.

Package substrates with integrated stiffeners and their methods of fabrication are disclosed. In one embodiment of the invention, a package substrate includes a substrate having a first-level interconnect (FLI) side and a second-level interconnect (SLI) side. Each side may include a plurality of pads for connecting to integrated circuits and/or system boards. A stiffener may be attached to the FLI side of the package substrate by an adhesive layer. The stiffener may have tabs that extend from an edge of the stiffener to an edge of the substrate. In an embodiment, the tabs do not extend along an entire edge of the stiffener. The tabs may also extend from the corners of the stiffener. In an embodiment, the stiffener is formed of a metal, ceramic, or an organic material.

According to an additional embodiment of the invention, a method for forming a package substrate with an integrated stiffener includes providing a panel of package substrates. An adhesion layer may be formed on each package substrate of the panel of package substrates. For example, the adhesion layer may be squeegee printed or vacuum laminated on each package substrate. The method may further include attaching a panel of stiffeners on the panel of package substrates. Each stiffener of the panel of stiffeners may correlate with a respective package substrate of the panel of package substrates. The adhesion layer attaches the two panels together. Once the panels are attached, the joined panels may be singulated to form individual package substrates with integrated stiffeners.

Embodiments of the invention disclosed herein provide a method that integrates a stiffener with a package substrate at the panel level prior to singulation. Attaching the stiffener at the panel level prior to singulation has several advantages over attaching the stiffener at the singulated level subsequent to singulation. For instance, attaching the stiffener at the panel level increases alignment accuracy between the stiffener and the package substrate. Increasing alignment accuracy may increase yield by minimizing defects caused by misalignment. Additionally, increasing alignment accuracy may lower alignment tolerances. Lower alignment tolerances minimize extension distances of package substrate edges, which thereby decreases package substrate size.

Attaching the stiffener at the panel level also lowers the cost and increases the throughput of integrating stiffeners on package substrates by taking advantage of a bulk processing approach. For example, many stiffeners in a panel may be integrated on many package substrates in a panel with just one alignment and bonding step. Accordingly, only the cost and processing time of one alignment and bonding step is incurred to form several integrated stiffeners, as opposed to the cost and processing time of several alignment and bonding steps incurred to form several integrated stiffeners.

Embodiments of the invention also increase throughput and decrease cost by removing the need to re-mark a package substrate. A package substrate typically contains a traceability mark for identification purposes. Current methods that utilize a transfer molding process cover up the traceability mark and must re-mark the package substrate. Re-marking the package substrate not only increases processing steps and cost, but it also decreases throughput. Embodiments of the invention however allow each stiffener in a panel to be marked with traceability marks before the start of the package assembly process. For instance, each stiffener in a panel of stiffeners may be pre-marked with traceability marks during its manufacturing. Thus, when the panel of stiffeners is attached to the panel of package substrates, the traceability mark is already exposed and a re-mark is not needed.

Furthermore, embodiments of the invention contribute to an underfill structure having a more uniform underfill fillet shape and higher mechanical integrity by reducing underfill keep out zone area. When a die is flip chip bonded to a package substrate, an underfill encapsulant is injected between the die and the package substrate. Current methods utilize the capillary properties of the underfill encapsulant to fill in the space between the die and the package substrate. Such methods often result in an underfill tongue that extends past the edge of the die as far as excess underfill encapsulant can flow. Any part of the package substrate reachable by the excess underfill encapsulant is an undesirable area (i.e., keep out zone area). According to embodiments of the invention, attaching the stiffener prior to singulation allows the stiffener to perform as a dam for the underfill encapsulant. Thus, the underfill encapsulant is physically prevented from forming larger keep out zone areas, thereby decreasing package substrate size.

With reference now to FIGS. 1A-4E, a method of forming a package substrate with an integrated stiffener is illustrated in accordance with an embodiment of the invention. Specifically, FIG. 1A illustrates a top-view perspective of an exemplary panel 102 of an array of package substrates 100. It is to be appreciated that each package substrate 100 illustrated in FIG. 1A represents a corresponding portion of the panel 102 that will be later singulated into an individual package substrate 100, as will be discussed herein. The panel 102 may be a quarter panel that includes an array of package substrates 100 with any suitable arrangement of rows (N) and columns (M) that forms an N×M array of package substrates 100. For instance, the panel 102 may include a 4×7 array of package substrates 100 as illustrated in FIG. 1A. In an embodiment, the panel 102 further includes alignment holes 112 in the periphery 105 of the panel 102. The alignment holes 112 may be used to mechanically align the panel 102 and the array of package substrates 100 with subsequent panels, such as a panel containing a corresponding N×M array of stiffeners, as will be discussed herein. Although the panel 102 has alignment holes 112 for mechanical alignment, the panel 102 may be optically aligned with subsequent panels by an optical alignment tool as well.

Further illustrated in FIG. 1A, each package substrate 100 may be separated from adjacent package substrates by separation gaps 114. Separation gaps 114 allow each package substrate 100 to have sufficient separation distances for individualized fabrication. In an embodiment, the separation gaps 114 may have a separation distance sufficient to completely isolate each package substrate 100 from one another. For instance, any distance greater than 0 mm and less than 5 mm may be sufficient. In a particular embodiment, the separation gap 114 has a separation distance of 1-3 mm.

Figure 1B:
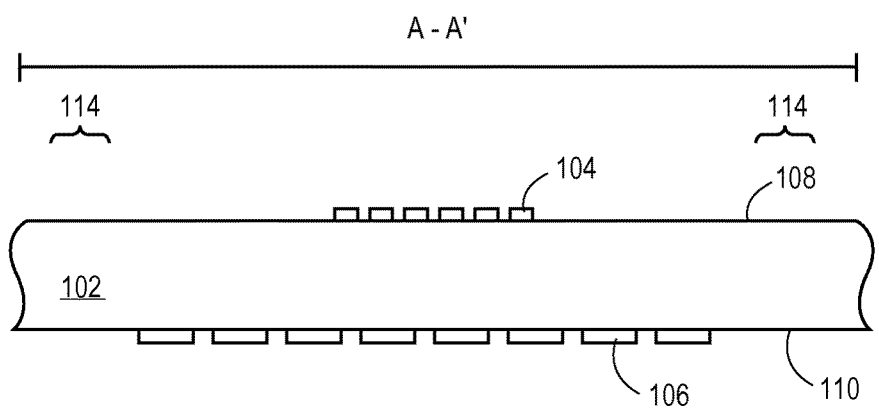
FIG. 1B illustrates a cross-sectional perspective of a portion of the panel of package substrates illustrated in FIG. 1A, in accordance with an embodiment of the invention.

Each package substrate 100 may include an array of top pads 104 as illustrated in FIG. 1A. The array of top pads 104 may be located near the center of each package substrate 100 for embodiments where a die will be flip chip bonded to the package substrate 100. Alternatively, the array of top pads 104 may be located near the edge of each package substrate 100 for embodiments where a die will be wire bonded to the package substrate 100, which is not illustrated in FIG. 1A. In an embodiment, each package substrate 100 may also include an array of bottom pads 106 as illustrated in FIG. 1B. FIG. 1B illustrates a cross-sectional view of FIG. 1A along the line A-A'. The line A-A' extends through an entire package substrate 100 and partially into laterally adjacent package substrates to better show the separation gaps 114 during fabrication. As illustrated in FIG. 1B, each package substrate 100 may have a first level interconnect (FLI) side 108 and a second level interconnect (SLI) side 110. The top pads 104 may be disposed on the FLI side 108 and the bottom pads 106 may be disposed on the SLI side 110.

Figure 2A:
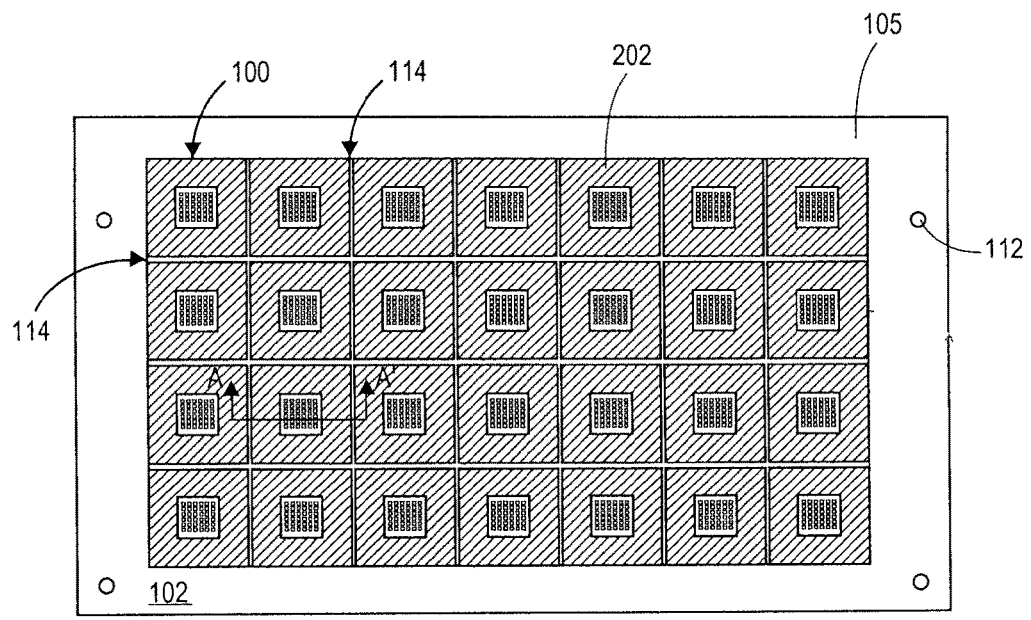
FIG. 2A illustrates a top-view perspective of the panel of package substrates illustrated in FIG. 1A with an adhesion layer, in accordance with an embodiment of the invention.

Next, in FIG. 2A, an adhesion layer 202 is formed on the panel 102 of the array of package substrates 100. The adhesion layer 202 may be formed by any suitable deposition technique. For instance, the adhesion layer 202 may be dispensed, printed, or overlayed as a film. In an embodiment, the adhesion layer 202 is screen printed or vacuum laminated on the panel 102. In embodiments, the adhesion layer 202 is dispensed while aligning to alignment pins inserted through the alignment holes 112 of the panel 102.

Figure 2B:
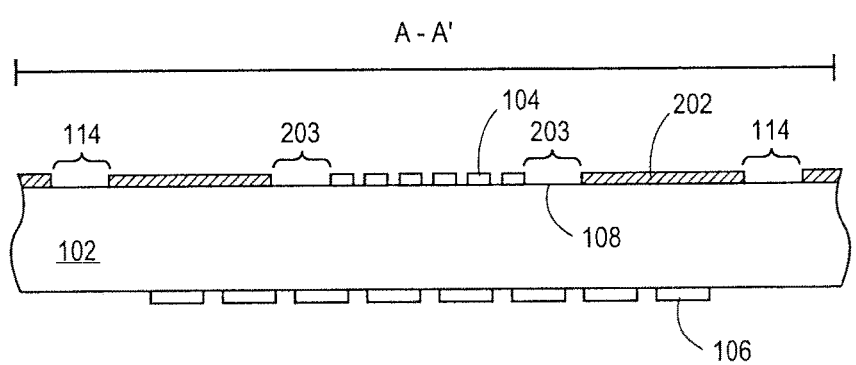
FIG. 2B illustrates a cross-sectional perspective of a portion of the panel of package substrates with an adhesion layer illustrated in FIG. 2A, in accordance with an embodiment of the invention.

Adhesion layer 202 may attach structures to the panel 102, such as a panel of stiffeners, as will be discussed herein. Accordingly, the adhesion layer 202 may be formed to a thickness sufficient to form an attachment bond strong enough to withstand subsequent processing conditions. For instance, the adhesion layer 202 may be between 25 to 40 μm thick. As shown in FIG. 2B, which illustrates the cross-sectional view of FIG. 2A along line A-A', the adhesion layer 202 may be formed on top of the panel 102. For instance, the adhesion layer 202 may be formed on portions of each package substrate 100 surrounding the top pads 104. In embodiments, the adhesion layer 202 is not formed on the top pads 104. In an embodiment, the adhesion layer 202 is formed a certain distance away from the top pads 104. Specifically, the adhesion layer 202 may be formed outside of a keep out zone area 203 where underfill encapsulant may be formed, as will be discussed further herein. To maintain separation between adjacent package substrates, the adhesion layer 202 may not be disposed within the separation gaps 114.

Adhesion layer 202 may be formed of any suitable adhesive material. For instance, adhesion layer 202 may be formed of a thermoset adhesive or a thermoplastic adhesive. In an embodiment, the adhesion layer 202 is formed of an epoxy, which may be filled with an inorganic filler such as silica.

Figure 3A:
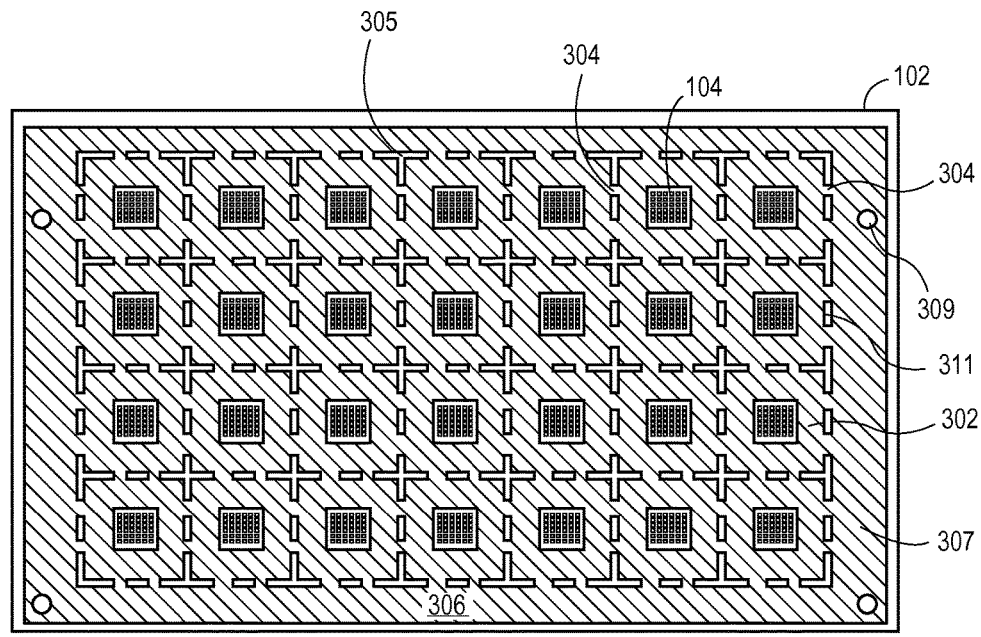
FIG. 3A illustrates a top-view perspective of a panel of stiffeners having side connections attached to the panel of package substrates illustrated in FIG. 1A, in accordance with an embodiment of the invention.

Once the adhesion layer 202 is formed, a panel 306 of stiffeners 302 may be attached to the panel 102 of package substrates 100, as illustrated in FIG. 3A. In an embodiment, the panel 306 of stiffeners 302 is aligned to the panel 102 of package substrates 100 and then laminated. A heat treatment process may be performed during the lamination process to cure the adhesion layers 202. When cured, the adhesion layer 202 securely bonds the panel 306 to the panel 102.

Panel 306 may be mechanically aligned to the panel 102 by utilizing alignment holes 309 of the panel 306. For instance, an alignment pin may insert through corresponding alignment holes 309. In embodiments, alignment holes 309 are located in the periphery 307 of the panel 306. The alignment holes 112 of the panel 102 may be located in areas identical to the alignment holes 309 of the panel 306. Accordingly, when the alignment pin is inserted though both corresponding alignment holes 112 and 309, the panels 102 and 306 are substantially aligned with one another. As such, the alignment accuracy may depend on the tolerances for the alignment holes. In embodiments, the panel 102 of package substrates 100 and the panel 306 of stiffeners 302 are manufactured according to the same design dimensions. As such, the location of each package substrate 100 and stiffener 302 may be substantially identical. When the panel 306 is aligned to the panel 102 by the alignment pin, each stiffener 302 is consequently aligned to each corresponding package substrate 100.

Panel 306 may also be optically aligned to the panel 102 by utilizing an optical alignment tool. In such instances, an optical alignment tool may perform alignment by utilizing an alignment mark that can be observed to indicate when alignment is made. Accordingly, the accuracy may depend on the accuracy tolerances of the specific alignment equipment. For example, tools with lower tolerances attach panel 306 to panel 102 with higher alignment accuracy.

In embodiments, aligning the package substrates 100 with their corresponding stiffeners 302 at a panel level substantially increases alignment accuracy. Rotational and/or translational misalignment may be completely eliminated when the stiffeners 302 are aligned with the package substrate 100 at a panel level. Accordingly, the possibility of overhang from translational misalignment and/or rotational misalignment may be substantially minimized and the package substrate size may thus be decreased.

The panel 306 of stiffeners 302 may include an N×M array of stiffeners 302 that correspond with respective package substrates 100 in the panel 102. Each stiffener 302 may be separated from one another by openings 305. The openings 305 may overlap with the separation gaps 114 to match separation of stiffeners 302 with the separation of package substrates 100. In an embodiment, each stiffener 302 is connected to adjacent stiffeners 302 and/or the periphery 307 by side connections 304. Side connections 304 hold the stiffeners 302 in place so that the panel 306 is substantially one piece. In an embodiment, side connections 304 are formed during fabrication of the panel 306 such that the side connections 304, stiffeners 302, and the periphery 307 form one monolithic structure (i.e., panel 306). As shown in FIG. 3A, the side connections 304 do not extend across the entire outer edge 311 of a stiffener 302. Instead, side connections 304 extend across only a portion of the outer edge 311 of a stiffener 302. Extending only a portion of the outer edge 311 of the stiffener 302 reduces mechanical stress on a cutting blade during singulation, as will be discussed further herein.

Figure 3B:
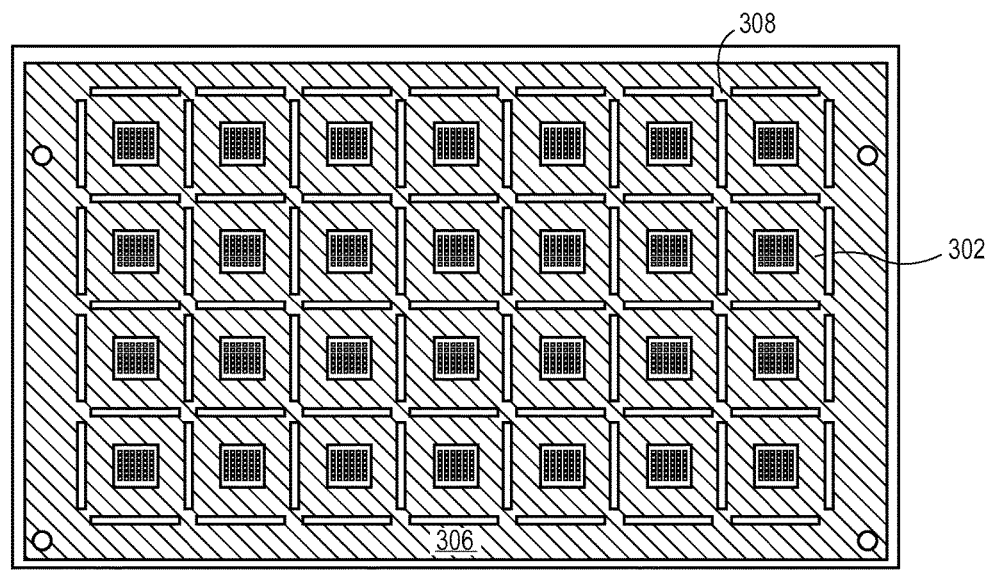
FIG. 3B illustrates a top-view perspective of a panel of stiffeners having corner connections attached to the panel of package substrates illustrated in FIG. 1A, in accordance with an embodiment of the invention.
Figure 3C:
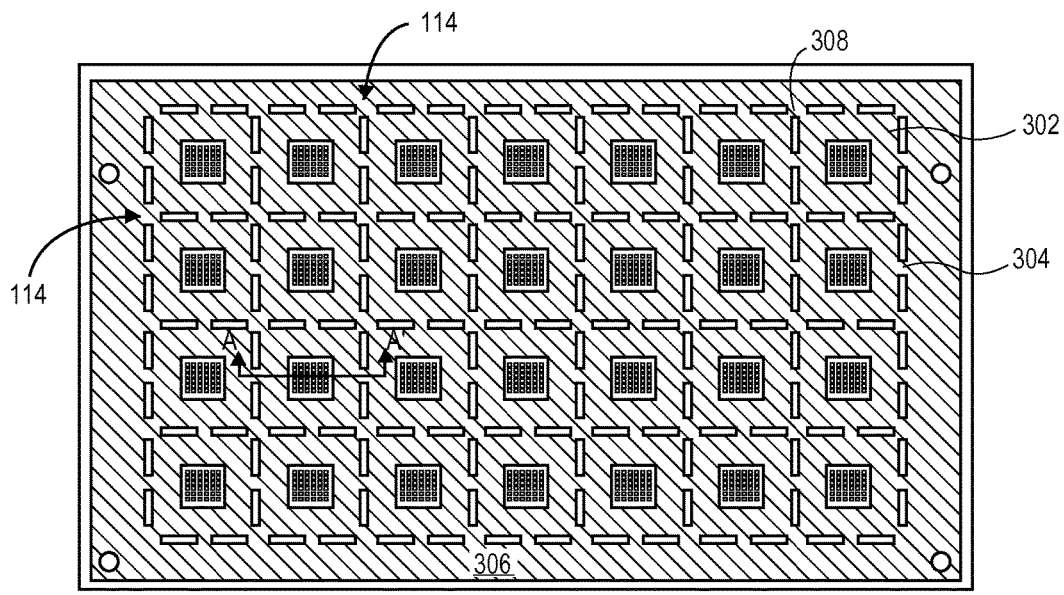
FIG. 3C illustrates a top-view perspective of a panel of stiffeners having side and corner connections attached to the panel of package substrates illustrated in FIG. 1A, in accordance with an embodiment of the invention.

Although FIG. 3A illustrates side connections 304 extending from the outer edges 311 of a stiffener 302, embodiments are not limited to such configurations. For instance, corner connections 308 may extend from the corner of each stiffener 302 as shown in FIG. 3B. In such instances, corner connections 308 hold each stiffener 302 in place to form one monolithic panel 306 of stiffeners 302. Corner connections 308 may also prevent formation of stiffeners 302 with exposed corners. Exposed corners may be vulnerable to damage during handling of the packages after panel singulation. In an embodiment, panel 306 may include an array of stiffeners 302 held together by corner connections 308 as well as side connections 304 as shown in FIG. 3C. Utilizing both side connections 304 and corner connections 308 stabilizes both the sides of the stiffeners 302 as well as the corners of the stiffeners 302.

Figure 3D:
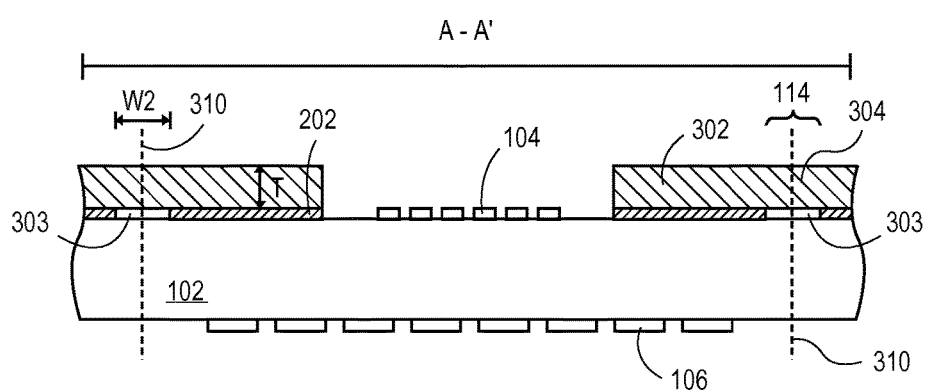
FIG. 3D illustrates a cross-sectional perspective of a portion of the panel of stiffeners having side connections and corner connections attached to a panel of package substrates illustrated in FIG. 3C, in accordance with an embodiment of the invention.

FIG. 3D illustrates a stiffener 302 of panel 306 attached to a package substrate 100 of panel 102. As shown, FIG. 3D is a cross-sectional view of FIG. 3C along the line A-A'. In embodiments, connections 304 and 308 are formed within the separation gaps 114. Because the adhesion layer 202 is not disposed in the separation gaps 114, adhesion layer 202 may not directly adhere the connections 304 to the panel 102 of package substrates 100. Accordingly, cavities 303 may be formed between the connections 304 and the panel 102. In some cases, however, the adhesion layer 202 may be forced into the separation gap 114 when the stiffener 302 is attached. For instance, the adhesion layer 202 may be squeezed onto a portion of the separation gap 114 when the stiffener 302 is laminated onto the adhesion layer 202. In such instances, the adhesion layer 202 may be disposed in a portion of the separation gap 114. Additionally, the adhesion layer 202 may be squeezed to a point where the adhesion layer 202 extends across the entire separation gap 114. Accordingly, the adhesion layer 202 may be disposed underneath the stiffener 302 as well as the connections 304 and 308.

Stiffeners 302 may be formed of any suitable thickness T sufficient to prevent warpage of the package substrates 100. Generally, thicker stiffeners 302 result in a greater degree of warpage reduction. However, it is to be appreciated that stiffeners 302 with thicknesses T that are too thick may make it difficult to singulate the panel 102 of package substrates 100 and increase the overall package thickness which is detrimental in very thin system applications. For instance, a very thick stiffener 302 is difficult to saw through and may cause premature wear of a cutting blade. The thickness T of the stiffeners 302 may also be modified based upon the modulus of the stiffener material. For instance, stiffeners 302 formed of a material with a higher modulus, such as stainless steel, may have a thinner thickness T. Alternatively, stiffeners 302 formed of a material with a lower modulus may have a thicker thickness T. Accordingly, embodiments of the invention may include a thickness T that is between approximately 100 to 300 µm.

The material used to form the stiffeners 302 of the panel 306 may be further selected based upon its coefficient of thermal expansion (CTE). CTE is the tendency of a material to change in volume in response to a change in temperature. Two materials with different CTEs will change in volume at different rates when exposed to the same temperature. Thus, a structure composed of two materials with different CTEs will warp under certain temperatures. To minimize such warpage, the CTE of the two materials should closely match. Accordingly, the material used to form the stiffeners 302 may be chosen to closely match the CTE of the package substrates 100. In embodiments, stiffeners 302 are formed of a metal, ceramic, or an organic material. In an embodiment, the stiffeners 302 are formed of copper or steel.

After attaching panel 306 to panel 102, an optional thermal treatment may be performed to cure the adhesion layer 202. For instance, if the adhesion layer 202 is formed of a thermoset material (e.g., epoxy) a thermal treatment at a temperature between 100 to 300° C. may be performed. Once the panel 306 is securely attached, the panel 306 provides mechanical reinforcement to the panel 102. Providing mechanical reinforcement increases the panel's 102 resistance to inadvertent handling damage.

Figure 4A:
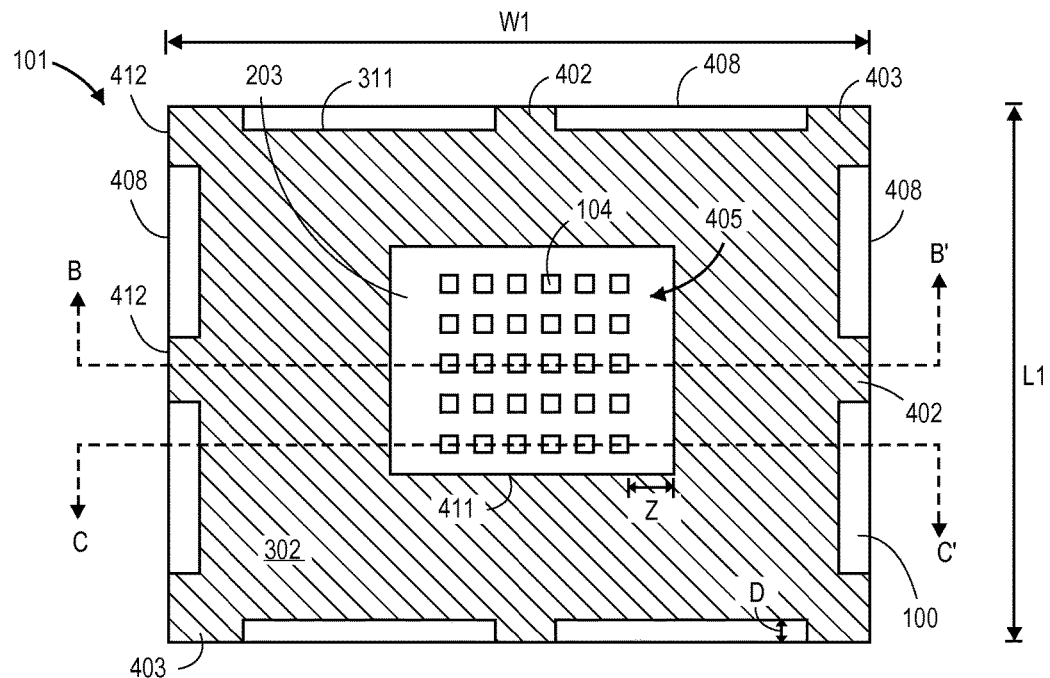
FIG. 4A illustrates a top-view perspective of a singulated package substrate with integrated stiffener where the stiffener has side tabs and corner tabs, in accordance with an embodiment of the invention.

Thereafter, the attached panels 306 and 102 may be singulated to form individual package substrates with integrated stiffeners 101 as illustrated in FIG. 4A. The attached panels 306 and 102 may be singulated by a thin diamond cutting blade that cuts along the separation gaps 114 and down lines 310, which are shown in FIG. 3D. Accordingly, in an embodiment, the side connections 304 and/or the corner connections 308 of the stiffeners 302 are cut during panel singulation. In such an embodiment, the rest of the stiffener body 302 is not substantially cut. Cutting only the connections 304 and 308 and the panel 102 minimizes blade wear during panel singulation, which saves cost by increasing blade life and consequently decreasing the frequency of blade replacement.

Other techniques may be used to singulate the attached panels 306 and 102. For instance, laser cutting or water jet cutting may be used to singulate the attached panels 306 and 102. The laser or water jet may cut along the separation gaps 114 and down lines 310 to cut only the side connections 304 and/or the corner connections 308 without substantially cutting the rest of the stiffener body 302. The rate at which the laser or water jet cuts through the panels 306 and 102 may depend on the thickness and material of the structure being cut. For instance, thinner structures may be cut faster than thicker structures. Accordingly, cutting only the panel 102 and connections 304/308 as opposed to the entire stiffener 302 increases throughput by minimizing cutting time.

Figure 4B:
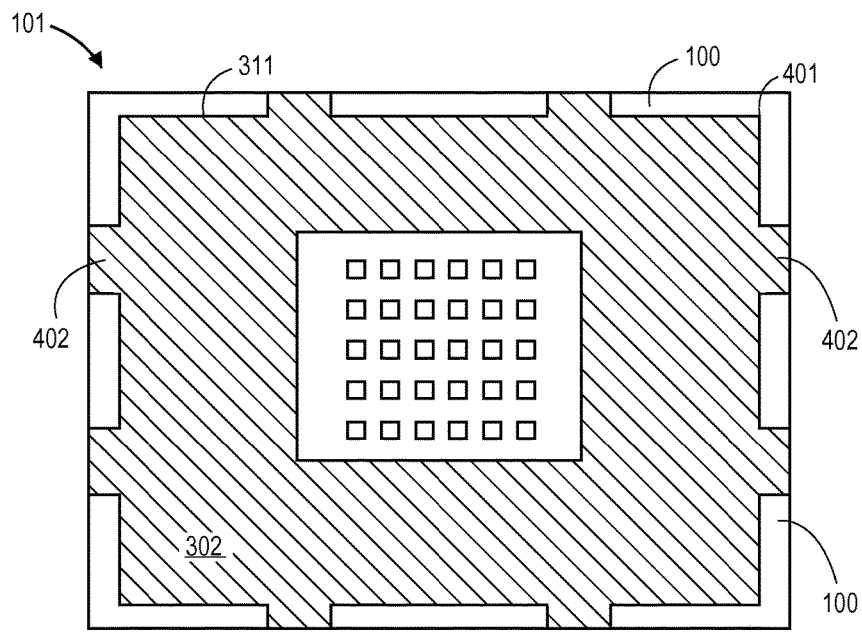
FIG. 4B illustrates a top-view perspective of a singulated package substrate with integrated stiffener where the stiffener has side tabs, in accordance with an embodiment of the invention.
Figure 4C:
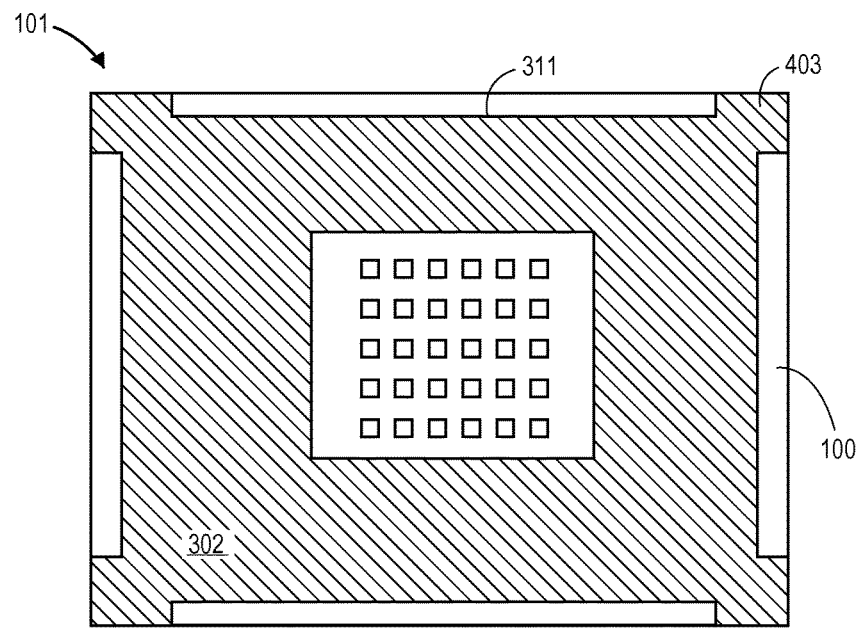
FIG. 4C illustrates a top-view perspective of a singulated package substrate with integrated stiffener where the stiffener has corner tabs, in accordance with an embodiment of the invention.

FIG. 4A illustrates a top-view perspective of a singulated package substrate with integrated stiffener 101, according to an embodiment of the invention. Specifically, FIG. 4A is an illustration of a singulated package substrate with integrated stiffener 101 after singulating the panels 306 and 102 of FIG. 3C. The package substrate with integrated stiffener 101 includes a stiffener 302 disposed on a package substrate 100. In embodiments, the stiffener 302 includes side tabs 402 and corner tabs 403. Side tabs 402 and corner tabs 403 may be formed when the side connections 304 and corner connections 308 are cut during panel singulation. Specifically, remaining portions of the connections 304 and 308 may form the tabs 402 and 403. Although FIG. 4A illustrates a package substrate with integrated stiffener 101 having a stiffener 302 with side tabs 402 and corner tabs 403, embodiments are not so limited. For instance, the stiffener 302 may only have side tabs 402 as illustrated in FIG. 4B or only corner tabs 403 as illustrated in FIG. 4C. With brief reference to FIG. 4B, FIG. 4B is an illustration of a singulated package substrate with integrated stiffener 101 after singulating the panels 306 and 102 of FIG. 3A. The stiffener 302 having only side tabs 402 may have exposed corners 401 of the stiffener 302. Although FIG. 4B only illustrates two tabs 402 on each outer edge 311, embodiments are not so limited. For instance, the stiffener 302 may have one tab 402 or more than two tabs 402 on each outer edge 311. With brief reference to FIG. 4C, FIG. 4C is an illustration of a singulated package substrate with integrated stiffener 101 after singulating the panels 306 and 102 of FIG. 3B. The stiffener 302 having only corner tabs 403 may have longer outer edges 311.

With reference back to FIG. 4A, tabs 402 and 403 have outer edges 412. Outer edges 412 of tabs 402 and 403 may substantially overlap with the edges 408 of the package substrate 100. In an embodiment, tabs 402 and 403 do not extend along the entire width W1 or length L1 of the package substrate 100. For instance, each of tabs 402 and 403 may extend across a portion of the width W1 or length L1 of the package substrate 100. In an embodiment, each of tabs 402 and 403 extend a distance between 1-3 mm across the corresponding width W1 and/or length L1 of the package substrate 100.

Additionally, tabs 402 and 403 may extend a distance D away from the outer edges 311 of the stiffener 302. The magnitude of distance D may vary depending on several factors. For instance, distance D may depend on the width W2 of separation area 114 as illustrated in FIG. 3D. Wider separation areas 114 may result in longer connections 304 and 308. Thus, the longer connections 304 and 308 form tabs 402 and 403 that extend longer distances D after panel singulation. In another example, distance D may depend on a diamond cutting blade's width. Generally, wider diamond cutting blades have wider kerf widths. Wider kerf widths remove greater portions of the connections 304 and 308 during panel singulation, which thus form tabs 402 and 403 that extend shorter distances D. In an embodiment, the distance D is less than 4 mm. In a particular embodiment, the distance D is approximately 0.5 mm to 2 mm.

The width W1 and length L1 of the singulated package substrate with integrated stiffener 101 may vary depending on design. For example, the width W1 and length L1 may have equal magnitudes that form a substantially square profile. Alternatively, the width W1 and length L1 may have different magnitudes that form a rectangular profile. In embodiments, the width W1 and length L1 are at least about 17 mm. In an embodiment, the width W1 and length L1 are at least about 25 mm. In a particular embodiment, the width W1 is approximately 25 mm and the length L1 is approximately 50 mm.

Stiffener 302 may include a top pad opening 405 that exposes the top pads 104. Top pads 104 are exposed so that an integrated circuit, such as a die, may interconnect with the top pads 104. In embodiments, a keep out zone area 203 is located in regions of the top surface of the package substrate 100 disposed between the outermost top pads 104 and an inner edge 411 of the stiffener 302. As already mentioned herein, the keep out zone area 203 may be a region of the top surface of the package substrate 100 where an underfill encapsulant may form for flip-chip bonding. In embodiments, the keep out zone area 203 may span a distance Z away from the outermost top pads 104. According to embodiments of the present invention, the highly accurate alignment method discussed herein allows the keep out zone area 203 to span a minimal distance Z. For instance, the distance Z may be less than 3 mm. In a particular embodiment, the distance Z is approximately 2 mm.

Figure 4D:
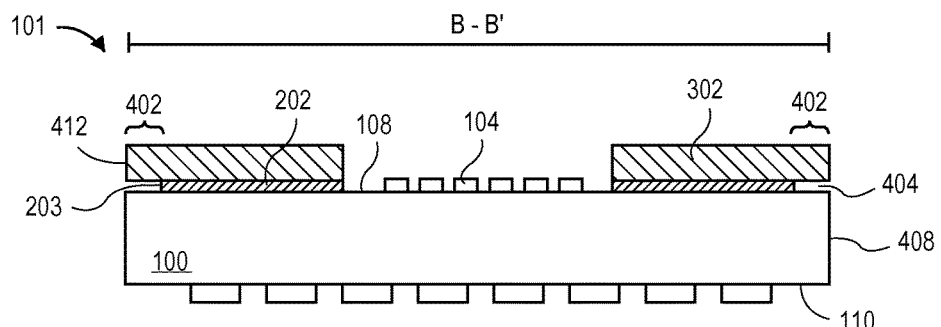
FIGS. 4D-4E illustrate cross-sectional views of the singulated package substrate with integrated stiffener where the stiffener has side tabs and corner tabs illustrated in FIG. 4A, in accordance with an embodiment of the invention.
Figure 4E:
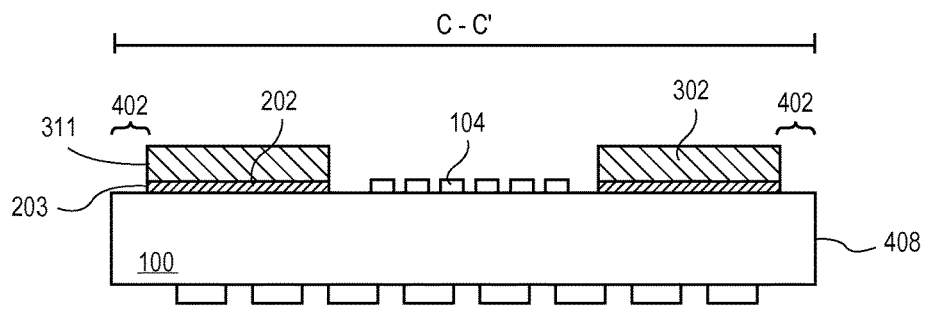

FIGS. 4D and 4E illustrate cross-sectional views of a singulated package substrate with integrated stiffener 101. Specifically, FIG. 4D illustrates a cross-sectional view of FIG. 4A across line B-B' where the tabs 402 are located, while FIG. 4E illustrates a cross-sectional view of FIG. 4A across line C-C' where the tabs 402 are not located. The purpose of these figures is to illustrate the cross-sectional profile of the package substrate with integrated stiffener 101 as well as to highlight the structural differences between a region with tabs 402/403 and a region without.

As shown in FIG. 4D, the singulated package substrate with integrated stiffener 101 includes a package substrate 100 and a stiffener 302. The stiffener 302 is attached to the FLI side 108 of the package substrate 100 by adhesive 202. As shown in FIG. 4D, the stiffener 302 has tabs 402 that extend to the edge 408 of the package substrate 100. In an embodiment, the outer edge 412 of the tab 302 is substantially coplanar with the edge 408 of the package substrate 100. The coplanarity may be caused by the substantially vertical cutting profile of the diamond cutting blade during panel singulation. In an embodiment, a cave 404 may be formed between the tabs 402/403 and the package substrate 100, and may have a depth that extends to an outer edge 203 of the adhesion layer 202. The cave 404 may be an artifact resulting from cutting through the cavity 303 during panel singulation. Accordingly, the outer edge 203 of the adhesion layer 202 may not extend to the edge 408 of the package substrate 100. With reference to FIG. 4E, the stiffener 302 does not have a tab 402/403 that extends to the edge 408 of the package substrate 100. Rather, in an embodiment, the outer edge 311 of the stiffener 302 extends to the outer edge 203 of the adhesion layer 202.

Figure 5:
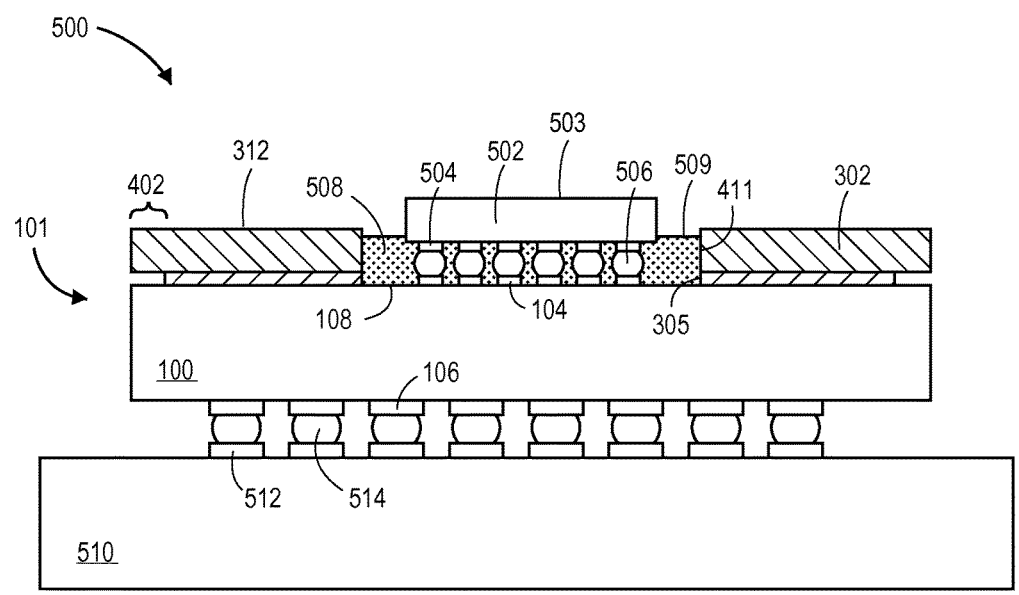
FIG. 5 illustrates a cross-sectional perspective of a package assembly including a package substrate with an integrated stiffener, in accordance with an embodiment of the invention.

Referring now to FIG. 5, a package assembly 500 including the package substrate with integrated stiffener 101 is illustrated, according to an embodiment of the invention. The package substrate with integrated stiffener 101 includes the package substrate 100 and the stiffener 302. In an embodiment, an integrated circuit, such as a die 502, is connected to top pads 104 by solder balls 506. Pads 504 on the die 502 may couple to the solder balls 506. The die 502 may be flip-chip bonded to the package substrate 100. In an embodiment, the top pads 104 are located below the die 502. Alternatively, the die 502 may be wire bonded (not shown) to top pads 104. In such instances, the pads 104 may not be located directly underneath the die 502, but located on the periphery of the package substrate 100 around the outside of the stiffener 302.

An underfill encapsulant 508 may be disposed in areas between the die 502 and the package substrate 100. In an embodiment, the underfill encapsulant 508 is pooled within a bowl formed by the FLI side 108 of the package substrate 100 and the inner edges 411 of the stiffener 302. Accordingly, the underfill encapsulant 508 may make contact with the inner edge 411 of the stiffener 302 and may have a top surface 509 lower than a top surface 312 of the stiffener 302. In an embodiment, the top surface 509 of the underfill encapsulant 508 is substantially horizontal. In an embodiment, the top surface 509 is slightly concave. The slightly concave profile may be an artifact created during formation of the underfill encapsulant 509. Typically, the underfill encapsulant 509 is injected below the die 502 as a liquid. The capillary properties of the encapsulant 509 as a liquid may cause the top surface 509 to have a concave profile.

In an embodiment, the die 502 extends above the stiffener 302. In such an embodiment, the top surface 312 of the stiffener 302 may be lower than the top surface 503 of the die 502. Accordingly, the top surface 503 of the die 502 may be accessible to make contact with a heat spreader or a heat sink for temperature regulation.

In embodiments, a second level interconnect structure, such as a system board 510, may be connected to the package substrate with integrated stiffener 101 by solder balls 514. The system board 510 may be a daughter card or a motherboard typically used in electronic devices. Pads 512 on the system board 510 may couple to the solder balls 514. The solder balls 514 may be coupled to bottom pads 106. Accordingly, the system board 510 may be electrically coupled to the die 502 by the package substrate with integrated stiffener 101.

Figure 6:
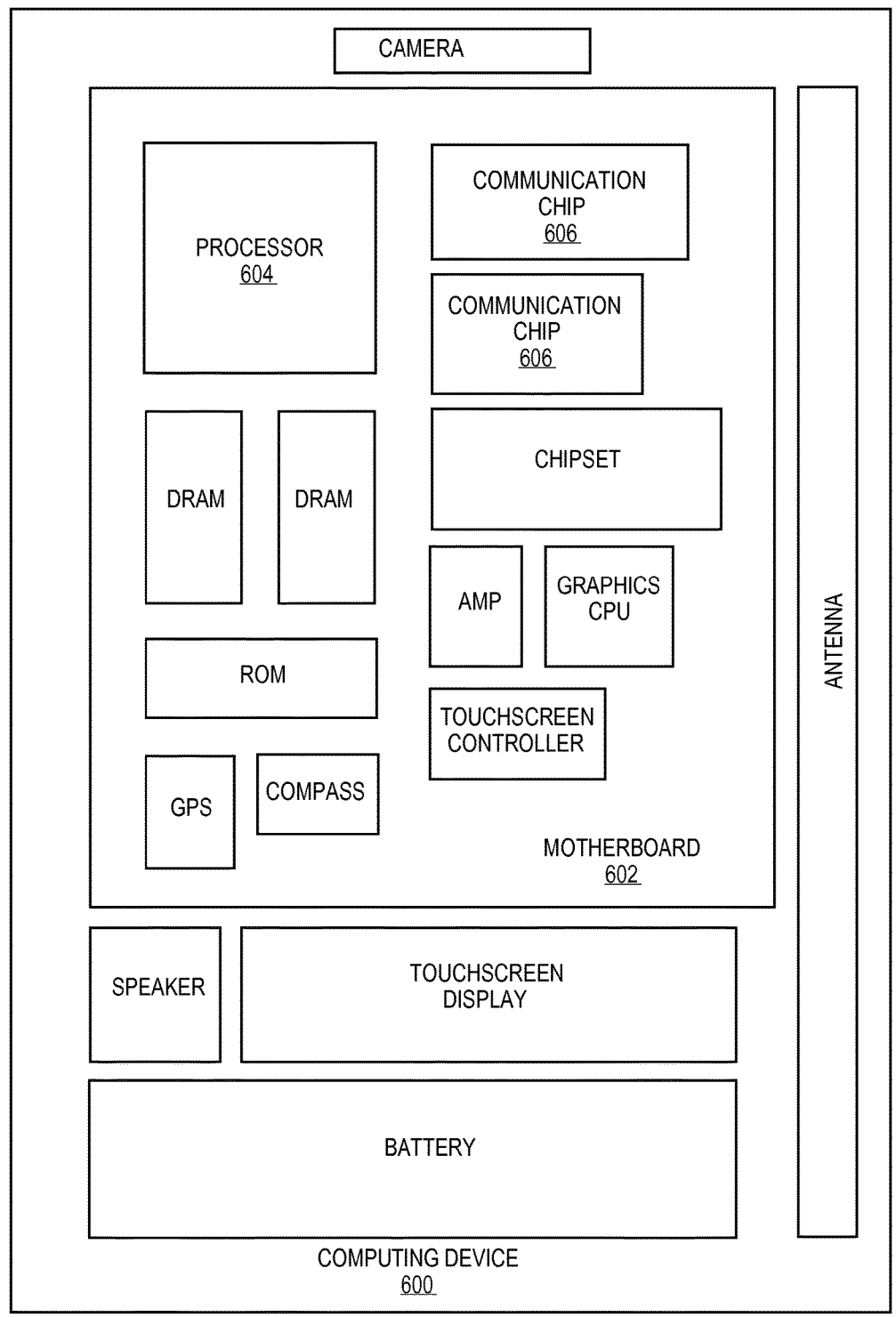
FIG. 6 illustrates a computing system implemented with one implementation of the invention.

FIG. 6 illustrates a computing system 600 implemented with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged with a package substrate with integrated stiffener formed in accordance with implementations of the invention. In some implementations of the invention, the integrated circuit die of the processor includes one or more semiconductor devices. The term "processor" may refer to any device or portion of a device that processes electronic data from registers and/or memory to transform that electronic data into other electronic data that may be stored in registers and/or memory.

The communication chip 606 also includes an integrated circuit die packaged with a package substrate with integrated stiffener formed in accordance with implementations of the invention. In accordance with another implementation of the invention, the integrated circuit die of the communication chip includes one or more semiconductor devices.

In further implementations, another component housed within the computing device 600 may contain package substrates with integrated stiffeners that are formed in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

In an embodiment, a package substrate includes a substrate having a first plurality of pads on a first surface and a second plurality of pads on a second surface opposite of the first surface, an adhesion layer disposed on the first surface and around the first plurality of pads, and a stiffener disposed on top of the adhesion layer and around the first plurality of pads, the stiffener having a tab that extends from a portion of an outer edge of the stiffener to an edge of the substrate.

The outer edge may have a portion that does not extend to the edge of the substrate. In an embodiment, the outer edge has a portion that does not extend to the edge of the substrate. The outer edge of the stiffener may be located on a side of the stiffener. In an embodiment, the outer edge of the stiffener is located at a corner of the stiffener. In an embodiment, the outer edge of the stiffener includes locations at both the sides and corners of the stiffener. The stiffener may be formed of a metal. In an embodiment, the stiffener is formed of stainless steel. The stiffener may be formed of a ceramic. In an embodiment, the stiffener is formed of an organic material.

In an embodiment, a device package includes a substrate having a first plurality of pads on a first surface and a second plurality of pads on a second surface opposite of the first surface, a semiconductor die coupled to the first plurality of pads, a second level interconnect (SLI) structure coupled to the second plurality of pads, an adhesion layer disposed on the first surface and around the first plurality of pads and the semiconductor die, and a stiffener disposed on top of the adhesion layer and around the first plurality of pads and the semiconductor die, the stiffener having a tab that extends from a portion of an outer edge of the stiffener to an edge of the substrate.

In embodiments, the device package further includes an underfill material disposed between the die and the first surface of the substrate. The underfill material may contact an inner edge of the stiffener. In an embodiment, the device package further includes an underfill keep out zone that is a region of the first surface disposed between the inner edge of the stiffener and the first plurality of pads. The distance between the inner edge of the stiffener and the first plurality of pads may be less than 2 mm. In an embodiment, the underfill material has a planar top surface. The planar top surface of the underfill material may be below the top surface of the stiffener. In an embodiment, the planar top surface is substantially horizontal. In an embodiment, the die extends above the stiffener. The outer edge of the stiffener may be located on a side of the stiffener. The outer edge of the stiffener may be located at a corner of the stiffener. In an embodiment, the outer edge of the stiffener includes locations at both the sides and corners of the stiffener.

In an embodiment, a method of fabricating a package substrate includes providing a panel of package substrates, forming an adhesion layer on each package substrate of the panel of package substrates, attaching a panel of stiffeners to the panel of package substrates by the adhesion layer, each stiffener of the panel of stiffeners corresponding to a respective package substrate of the panel of package substrates, and singulating the panel of package substrates into individual package substrates with stiffeners.

Attaching a panel of stiffeners on the adhesion layer includes providing the panel of stiffeners, and aligning the panel of stiffeners to the panel of package substrates by utilizing alignment holes placed at the edge of both the panel of stiffeners and the panel of package substrates. Aligning the panel of stiffeners to the panel of package substrates may include inserting the alignment holes of the panel of package substrates around an alignment pin, and inserting the alignment holes of the panel of stiffeners around the alignment pin. In an embodiment, aligning the panel of stiffeners to the panel of package substrates may further include curing the adhesion layer by a thermal treatment process. The adhesion layer may be formed by a lamination process. In an embodiment, the panel of stiffeners comprises an array of stiffeners, each stiffener is attached to an adjacent stiffener by connecting portions. The connecting portions may extend form a portion of an edge of one stiffener to an edge of another stiffener. The panel of package substrates may be singulated by cutting through both the package substrate and a plurality of connecting portions extending between individual stiffeners.

In utilizing the various aspects of this invention, it would become apparent to one skilled in the art that combinations or variations of the above embodiments are possible for forming package substrates with integrated stiffeners. Although embodiments of the present invention have been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating embodiments of the present invention.

What is claimed is:

1. A package substrate, comprising:
a substrate having a first plurality of pads on a first surface and a second plurality of pads on a second surface opposite of the first surface;
an adhesion layer disposed on the first surface and around the first plurality of pads; and
a stiffener disposed on top of the adhesion layer and around the first plurality of pads, the stiffener having a tab comprising a first portion of an outer edge of the stiffener that extends to an edge of the substrate, the tab having a length extending along a portion of the edge of the substrate, wherein a second portion of the outer edge of the stiffener does not extend to the edge of the substrate.

2. The package substrate of claim 1, wherein the first portion of the outer edge of the stiffener is located on a side of the stiffener.

3. The package substrate of claim 1, wherein the first portion of the outer edge of the stiffener is located at a corner of the stiffener.

4. The package substrate of claim 1, wherein the stiffener is formed of a metal.

5. A device package, comprising:
a substrate having a first plurality of pads on a first surface and a second plurality of pads on a second surface opposite of the first surface;
a semiconductor die coupled to the first plurality of pads;
a second level interconnect (SLI) structure coupled to the second plurality of pads;
an adhesion layer disposed on the first surface and around the first plurality of pads and the semiconductor die; and
a stiffener disposed on top of the adhesion layer and around the first plurality of pads and the semiconductor die, the stiffener having a tab comprising a first portion of an outer edge of the stiffener that extends to an edge of the substrate, the tab having a length extending along a portion of the edge of the substrate, wherein a second portion of the outer edge of the stiffener does not extend to the edge of the substrate.

6. The device package of claim 5, further comprising an underfill material disposed between the die and the first surface of the substrate.

7. The device package of claim 6, wherein the underfill material contacts an inner edge of the stiffener.

8. The device package of claim 7, further comprising an underfill keep out zone that is a region of the first surface disposed between the inner edge of the stiffener and the first plurality of pads.

9. The device package of claim 8, wherein the distance between the inner edge of the stiffener and the first plurality of pads is less than 2 mm.

10. The device package of claim 7, wherein the underfill material has a planar top surface.

11. The device package of claim 10, wherein the planar top surface of the underfill material is below the top surface of the stiffener.

12. The device package of claim 10, wherein the planar top surface is substantially horizontal.

13. The device package of claim 5, wherein the die extends above the stiffener.

14. The device package of claim 5, wherein the first portion of the outer edge of the stiffener is located on a side of the stiffener.

15. The device package of claim 5, wherein the first portion of the outer edge of the stiffener is located at a corner of the stiffener.

* * * * *